United States Patent
Schirmer et al.

(10) Patent No.: US 7,411,396 B1
(45) Date of Patent: Aug. 12, 2008

(54) METHOD AND SYSTEM OF MAGNETIC RESONANCE SPECTROSCOPY WITH VOLUME ELEMENT DISSECTION

(75) Inventors: Timo Schirmer, Hallbergmoos (DE); Michael Czisch, München (DE)

(73) Assignees: General Electric Company, Schenectady, NY (US); Max-Planck-Institut fur Psychiatrie, Munich (DE)

( * ) Notice: Subject to any disclaimer, the term of this patent is extended or adjusted under 35 U.S.C. 154(b) by 76 days.

(21) Appl. No.: 11/382,216

(22) Filed: May 8, 2006

(51) Int. Cl.
*G01V 3/00* (2006.01)
(52) U.S. Cl. .................... 324/309; 324/307
(58) Field of Classification Search ......... 324/300–322; 600/407, 410, 422
See application file for complete search history.

(56) References Cited

U.S. PATENT DOCUMENTS

| | | | | |
|---|---|---|---|---|
| 5,539,310 A | * | 7/1996 | Basser et al. | 324/307 |
| 5,617,861 A | * | 4/1997 | Ross et al. | 600/410 |
| 5,786,962 A | * | 7/1998 | Kawazoe | 360/234.5 |
| 6,617,169 B2 | * | 9/2003 | Ke et al. | 436/173 |
| 6,708,053 B1 | * | 3/2004 | Brooks et al. | 600/410 |
| 6,751,495 B2 | * | 6/2004 | Maier et al. | 600/410 |
| 6,991,777 B2 | * | 1/2006 | Driehuys et al. | 424/9.1 |
| 7,053,618 B2 | * | 5/2006 | Zhu | 324/318 |

OTHER PUBLICATIONS

Sodickson D.K. et al., "Simultaneous Acquisition of Spatial Harmonics (SMASH): Fast Imaging with Radiofrequency Coil Arrays," MRM 38:591-603 (1997).
Pruessmann K.P. et al., "Sense: Sensitivity Enoding for Fast MRI," Magnetic Resonance in Medicine 42:952-962 (1999).

* cited by examiner

*Primary Examiner*—Brij B Shrivastav
(74) *Attorney, Agent, or Firm*—Ziolkowski Patent Solutions Group, SC

(57) ABSTRACT

An MRI apparatus is presented that includes a computer programmed to sample a single volume element (voxel) for MR spectroscopy and automatically determine respective metabolite concentrations for multiple compartment contained in the single voxel. The invention is effective in assigning metabolite concentrations to specific tissue types on a per-voxel basis for a VOI. Moreover, the invention is effective in providing metabolite concentrations for a voxel independent of that voxel's vicinity relative to the coils of the phased array. The present invention provides an effective tool in assigning metabolite concentrations from mixed pathological and normal tissues.

20 Claims, 2 Drawing Sheets

METHOD AND SYSTEM OF MAGNETIC RESONANCE SPECTROSCOPY WITH VOLUME ELEMENT DISSECTION

BACKGROUND OF THE INVENTION

The present invention relates generally to magnetic resonance spectroscopy (MRS) and, more particularly, to a method and apparatus for single volume element (voxel) MRS that provides metabolite concentration values for identified tissues within a single voxel.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

MR spectroscopy is a common MR technique used for the determination of individual chemical compounds or metabolites located within a volume-of-interest (VOI). Single voxel MRS determines those metabolites on a per-voxel basis. The underlying principle of MRS is that atomic nuclei are surrounded by a cloud of electrons which slightly shield the nucleus from any external magnetic field. As the structure of the electron cloud is specific to an individual molecule or compound, the magnitude of this screening effect is then also a characteristic of the chemical environment of individual nuclei. Since the resonance frequency of the nuclei is proportional to the magnetic field it experiences, the resonance frequency can be determined not only by the external applied field, but also by the small field shift generated by the electron cloud. Detection of this chemical shift is usually expressed as "parts per million" (ppm) of the main frequency.

A drawback of conventional MRS techniques is the inability to segment or compartmentalize the tissues within a single voxel and, thus, provide a per-tissue type per-voxel metabolite concentration. Usually, a voxel is defined as cubic region of interest. As tissue types rarely have rectangular or cubic shapes, it is common for a single voxel to contain multiple tissue types. Different tissue types, however, have different metabolite concentrations contributing to the final spectrum. For example, for brain imaging, it is not uncommon for a given voxel to contain white matter, gray matter, and cerebral spinal fluid (CSF). Since conventional single voxel MRS generates a spectrum from all the metabolites in the voxel, it is not feasibly possible to ascertain what tissue is contributing to the overall spectrum for a given voxel. That is, the resulting spectrum is defined as the sum of all signals from all contributing tissue types in the voxel. Thus, it is possible for the metabolite contribution of one tissue in the voxel to mask or hide the metabolite contribution from another tissue or abnormality in the voxel. This can be particularly problematic for diagnosing and treating abnormalities such as lesions, tumors, and the like. For example, the metabolite contribution by a cancerous tissue may be masked in conventional MRS by the metabolite contribution of a healthy, non-cancerous tissue also contained in the voxel.

Increasingly, phased array coil architectures are being used for MRS studies. MR imaging with phased array coils is an effective tool for reducing scan time by reducing the number of phase encoding steps during sampling of an MR echo. As is well-known, coil sensitivity information is typically used to supplement phase encode locations in k-space that were not conventionally acquired. In MRS studies, however, phased array acquisitions, albeit providing a scan time reduction, can lead to amplified metabolite signals for a given coil of the array based on that coil's proximity to the voxel in the VOI. In other words, due to the spatially inhomogeneous $B_1$ fields of the individual coils, metabolite signals of tissue closer to the individual coils will be amplified compared to signals of tissue with a large distance from the coils.

It would therefore be desirable to have a system and method capable of single voxel MRS that provides metabolite concentration for a particular tissue of interest contained within the voxel and that is independent of the location of the voxel relative to coils of a phased array configuration.

BRIEF DESCRIPTION OF THE INVENTION

The present invention provides a system and method for MR spectroscopy with volume element dissection that overcomes the aforementioned drawbacks. In this regard, the present invention provides respective metabolite concentrations for multiple compartment contained in a single voxel. The present invention assigns metabolite concentrations to specific tissue types on a per-voxel basis for a VOI. The present invention also provides metabolite concentrations for a voxel independent of that voxel's vicinity relative to the coils of a phased array.

Therefore, in accordance with one aspect of the present invention, an MRI apparatus is disclosed that includes a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images. The MRI apparatus further includes a computer programmed to sample a single volume element (voxel) for MR spectroscopy and automatically determine respective metabolite concentrations for multiple compartments contained in the single voxel.

In accordance with another aspect of the present invention, a method is disclosed that includes the step of sampling an imaging volume containing tissues of more than one type. The method further includes the step of determining a respective metabolite concentration in each tissue contained within the imaging volume for a metabolite under investigation.

In accordance with another aspect of the invention, the invention is embodied in a computer program stored on a computer readable storage medium and having instructions that cause the computer to sample a single voxel having a plurality of compartments with a coil array and determine a weighting of each coil of the coil array to the single voxel. The computer is further caused to segment the single voxel into the plurality of compartments and determine a respective metabolite concentration value for a given metabolite in each compartment of the single voxel.

In accordance with another embodiment of the present invention, a method of MR spectroscopy is disclosed that includes the step of sampling a single voxel with a phased array coil assembly, the single voxel capable of containing normal tissue and an abnormal pathology. The method further includes the step of determining a metabolite concentration value for a given metabolite in the abnormal pathology contained in the single voxel independent of metabolite concentration for the given metabolites corresponding to normal tissue contained in the single voxel.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
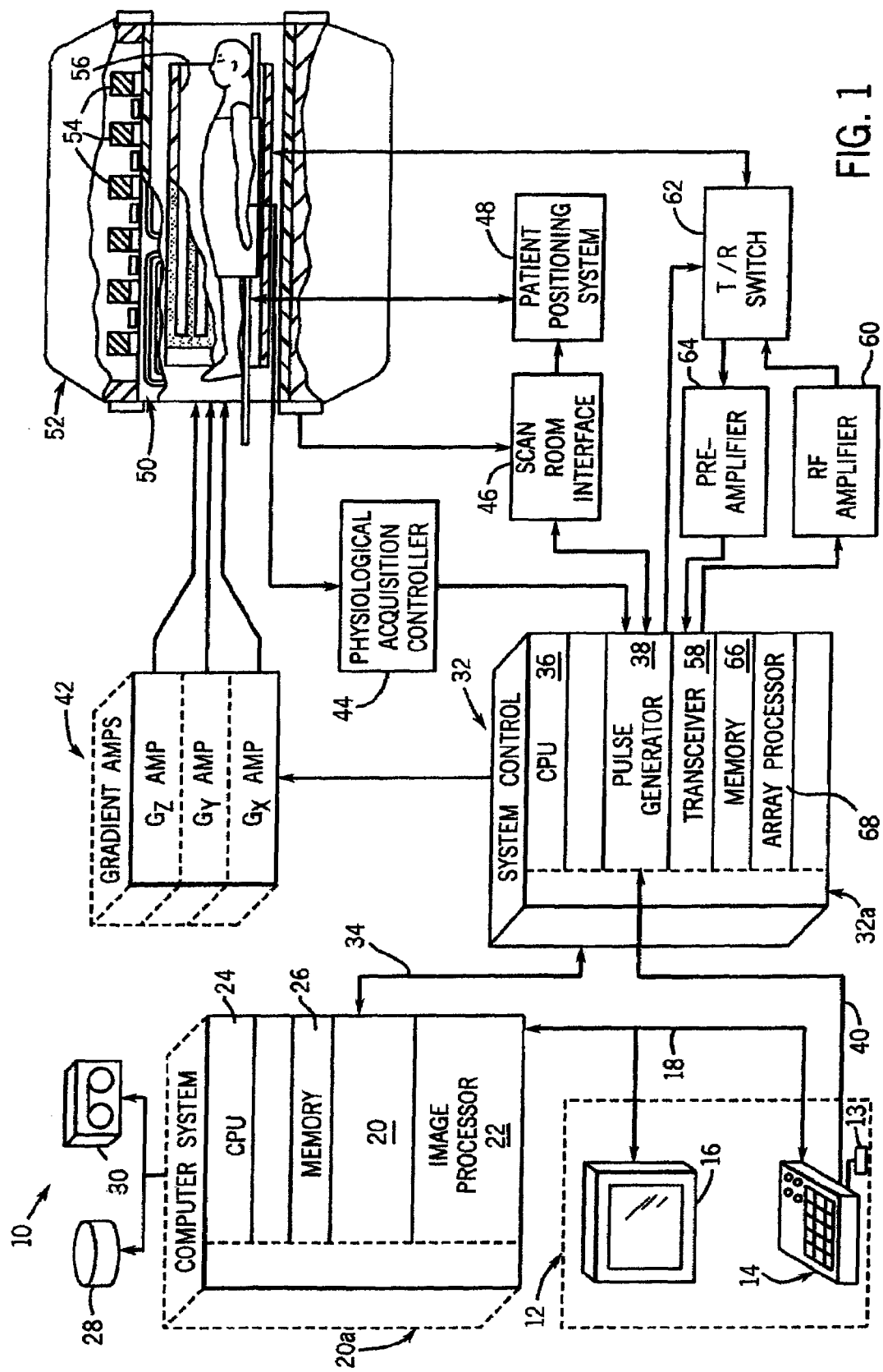
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil assembly (for example, a surface coil) to be used in either the transmit or receive mode. Additionally, a VOI may be sampled using a phased array coil architecture such that MR signals are acquired by each coil in parallel. Phased array coils not provide a sensitivity improvement relative to whole-body coils but may also be exploited to reduce scan time.

The MR signals picked up by the RF coil assembly 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

This invention is directed to a method to correct for coil weighting and tissue compartmentalization in a MR spectroscopy using additional information from the spectroscopy and imaging experiments with many element array coils, such as a phased array architecture. The present invention is particularly applicable with a 1.5T MRI scanner such as a GE Signa® LX scanner that is commercially available from GE Healthcare, Waukesha, Wis., but is applicable with other MR scanners. SIGNA is a registered trademark of General Electric Company, Fairfield, Conn. As will be described, MR spectroscopy data is acquired from a VOI with a multi-channel phased-array coil.

As is well-known, the signal S of metabolite M in a predefined voxel or localized VOI acquired by a RF coil in a MR spectroscopy study is proportional to the local concentration C of metabolite M. For a multi-element coil or multi-coil array, the signal acquired by an individual coil from a voxel will be weighted by its local sensitivity g(dV). Thus, the signal $S_{M,R}$ from metabolite M in a voxel acquired by coil R can be written as:

$$S_{M,R}(VOI) = \int_{voxel} g_R(V) * C_M(V) dV. \quad \text{(Eqn. 1)}$$

The linearity of the integral allows splitting the voxel into sub-volumes or compartments $voxel_n$:

$$S_{M,R}(voxel) = \sum_n \int_{voxel_n} g_R(V) * C_M(V) dV. \quad \text{(Eqn. 2)}$$

For example, in the case of healthy brain tissue, principal contributing compartments will be white matter, gray matter and CSF. Thus, Eqn. 2 can be expressed as:

$$S_{M,R}(VOI) = \int_{voxel} g_R(V) * C_M(V) dV + \quad \text{(Eqn. 3)}$$
$$\int_{voxel} g_R(V) * C_M(V) dV + \int_{voxel_{CSF}} g_R(V) * C_M(V) dV.$$

The metabolite concentrations in these compartments should show little or no variations for an appropriately sized voxel. Thus, Eqn. 3 can be simplified as:

$$S_{M,R}(voxel) = \left\{ C_{M,GM}(voxel_{GM}) * \int_{voxel_{GM}} g_R(V) dV \right\} + \quad \text{(Eqn. 4)}$$
$$\left\{ C_{M,WM}(voxel_{WM}) * \int_{voxel_{WM}} g_R(V) dV \right\} +$$
$$\left\{ C_{M,CSF}(voxel_{CSF}) * \int_{voxel_{CSF}} g_R(V) dV \right\}.$$

A skilled artisan will appreciate that the weighting factors $g_R(V)$ set forth in Eqns. 1-4 can be determined using one of a number of known $B_1$ mapping techniques. Further, any of a number of known segmentation techniques can be used to automatically outline the individual sub-volumes corresponding to the respective compartments, e.g., $voxel_{GM}$, $voxel_{WM}$, $voxel_{CSF}$. Thus, Eqn. 4 can be expressed as a linear equation with N unknowns. The number of unknown corresponds to the number of tissues contained within the single voxel. Continue with the above brain study, those unknowns would correspond to gray matter, white matter, and CSF, e.g., $C_{M,GM}(voxel_{GM})$, $C_{M,WM}(voxel_{WM})$ and $C_{M,CSF}(voxel_{CSF})$. Therefore, given:

$$G_R(voxel) = \int_{voxel} g_R(V) dV$$

Eqn. 4 can be expressed as a system of R equations:

$$S_{M,R}(voxel) = C_{M,GM}(voxel_{GM}) * G_R(voxel_{GM}) + C_{M,WM}(voxel_{WM}) * G_R(VOI_{WM}) + C_{M,CSF}(voxel_{CSF}) * G_R(voxel_{CSF}), R = [1 \ldots \text{number of coils}] \quad (5),$$

yielding, for this specific example, individual metabolite concentrations C for gray matter, white matter and CSF.

One skilled in the art will appreciate that the system of equations may be over-prescribed if the number of equations in the set exceeds the number of unknowns. However, it is contemplated that depending upon the particulars of the MRS study, the number of unknowns can be equal to the number of coils in the coil array.

Figure 2:
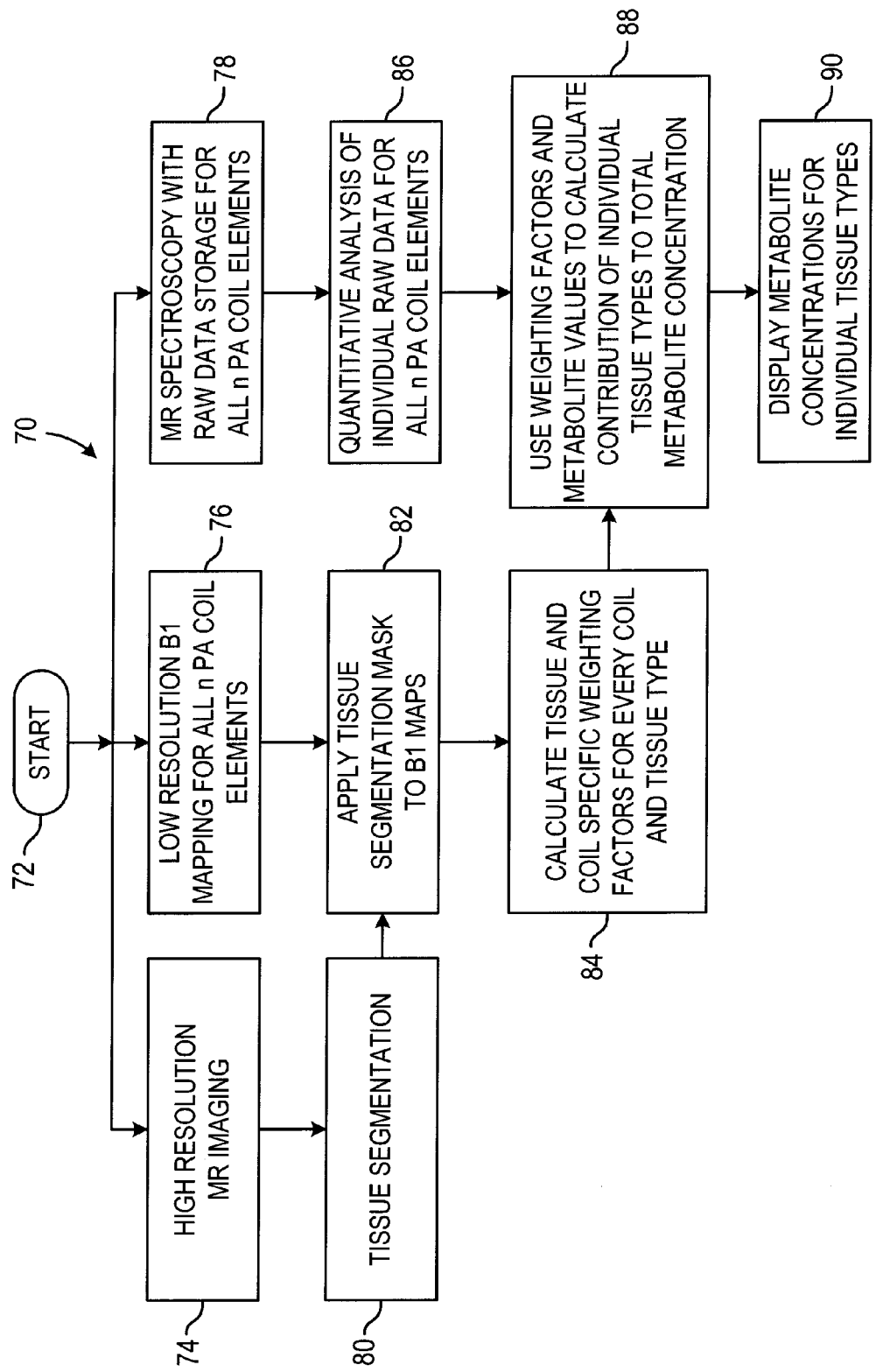
FIG. 2 is a flow chart setting forth the steps of an MRS acquisition in accordance with the present invention.

Accordingly and referring now to FIG. 2, an exemplary MRS acquisition 70 begins at 72 with the prescription of an MRS study. It is contemplated that the MRS study can be carried out concurrently with or separately from an MR imaging study. As shown in FIG. 2, the exemplary acquisition 70 takes advantage of high resolution MR imaging acquisition data 74, low resolution MR data to derive $B_1$ mapping for the coils of the phased array 76, and MRS data 78. It is contemplated that the $B_1$ map may be derived in a pre-scan for a given study or recalled from a look-up table or other computer readable medium.

The high resolution MR imaging data is processed by one of a number of tissue auto-segmentation algorithms 80 to provide tissue or compartment segmentation for each voxel of the VOI from which MRI and MRS data is acquired. Together with one of a number of known $B_1$ mapping algorithms, the tissue segmentation is applied to the $B_1$ maps for each coil. In this regard, a tissue specific and coil specific weighting factors are determined for each coil and each tissue type 84.

The acquired MRS data acquired or recalled at 78 is processed at 86 to provide a quantitative analysis of the individual raw data for all coils of the coil array. As a result, n metabolite concentration values are provided for each metabolite under investigation. That is, the processing at step 86 provides a metabolite concentration value for each metabolite under investigation for each voxel for each coil. In this regard, the concentrations differ from each other as a result of different tissue and coil specific weighting factors. Thus, the weighting factors determined at 84 are applied to the quantitative results of step 86 to calculate the contribution of individual tissue types to the total metabolite concentration for the voxel. As a result, the metabolite concentration for individual tissue types in a given voxel can be displayed at 90 in a conventional manner.

The invention is effective in assigning metabolite concentrations to specific tissue types on a per-voxel basis for a VOI. Moreover, the invention is effective in providing metabolite concentrations for a voxel independent of that voxel's vicinity relative to the coils of the phased array. In this regard, it is believed that the present invention provides an effective tool in assigning metabolite concentrations from mixed pathological and normal tissues. Additionally, while an exemplary of the invention has been described with respect to brain imaging, the invention is not so limited. The invention is flexible in its application and can be used in various other MRS studies, e.g., segmentation between an active tumor, necrosis, and/or healthy tissue, and segmentation between the inside of the hippocampus and the outside of the hippocampus.

In accordance with one embodiment of the present invention, an MRI apparatus is disclosed that includes a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images. The MRI apparatus further includes a computer programmed to sample a single volume element (voxel) for MR spectroscopy and automatically determine respective metabolite concentrations for multiple compartments contained in the single voxel.

In accordance with another embodiment of the present invention, a method of MR spectroscopy is disclosed that includes the step of sampling an imaging volume containing tissues of more than one type. The method further includes the step of determining a respective metabolite concentration in each tissue contained within the imaging volume for a metabolite under investigation.

In accordance with another embodiment of the invention, the invention is embodied in a computer program stored on a computer readable storage medium and having instructions that cause the computer to sample a single voxel having a plurality of compartments with a coil array and determine a weighting of each coil of the coil array to the single voxel. The computer is further caused to segment the single voxel into the plurality of compartments and determine a respective metabolite concentration value for a given metabolite in each compartment of the single voxel.

In accordance with another embodiment of the present invention, a method of MR spectroscopy is disclosed that includes the step of sampling a single voxel with a phased array coil assembly, the single voxel capable of containing normal tissue and an abnormal pathology. The method further includes the step of determining a metabolite concentration value for a given metabolite in the abnormal pathology contained in the single voxel independent of metabolite concentration for the given metabolites corresponding to normal tissue contained in the single voxel.

The present invention has been described in terms of the preferred embodiment, and it is recognized that equivalents, alternatives, and modifications, aside from those expressly stated, are possible and within the scope of the appending claims.

What is claimed is:

1. An MRI apparatus comprising:
   a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and
   a computer programmed to sample a single volume element (voxel) for MR spectroscopy and automatically determine respective metabolite concentrations for multiple compartments contained in the single voxel when the computer program is executed.

2. The MRI apparatus of claim 1 wherein the multiple compartments correspond to various tissues contained within the single voxel.

3. The MRI apparatus of claim 1 wherein the RF coil assembly includes a plurality of RF coils, each of which samples the single voxel.

4. The MRI apparatus of claim 3 wherein the computer is further programmed to auto-segment the single voxel to isolate each of the multiple compartments.

5. The MRI apparatus of claim 4 wherein the computer is further programmed to determine coil sensitivity of each RF coil to the single voxel and determine a coil weighting factor to each compartment from the coil sensitivity.

6. The MRI apparatus of claim 5 wherein the computer is further programmed to sample a volume-of-interest (VOI) having a plurality of voxels with acceleration in a phase encoding direction.

7. The MRI apparatus of claim 6 wherein the VOI includes a brain region with white matter, gray matter, and CSF.

8. A method of MR spectroscopy including the steps of:
   sampling an imaging volume containing tissues of more than one type; and
   determining a respective metabolite concentration in each tissue contained within the imaging volume for a metabolite under investigation.

9. The method of claim 8 wherein the imaging volume is sampled with a phased array of RF coils.

10. The method of claim 9 wherein the imaging volume is sampled with acceleration in a phase encoding direction.

11. The method of claim 9 wherein each coil of the phased array acquires an MR signal from a voxel and further comprising the step of independently determining respective metabolite concentrations for the metabolite under investigation in the tissues contained within the voxel from coil sensitivities to the voxel.

12. The method of claim 8 further comprising the step of auto-segmenting the voxel into multiple compartments, each compartment corresponding to a single tissue type.

13. The method of claim 12 wherein the imaging volume includes the brain of a patient and the compartments include white matter, gray matter, and CSF.

14. A computer readable storage medium having a computer program stored thereon representing instructions that cause a computer to:
   sample a single voxel having a plurality of compartments with a coil array;
   determine a weighting of each coil of the coil array to the single voxel;
   segment the single voxel into the plurality of compartments; and
   determine a respective metabolite concentration value for a given metabolite in each compartment of the single voxel when the computer program is executed.

15. The computer readable storage medium of claim 14 wherein the computer is caused to determine the weighting of each coil from a $B_1$ sensitivity map for the coil array.

16. The computer readable storage medium of claim 15 wherein each compartment corresponds to a respective tissue type.

17. The computer readable storage medium of claim 14 wherein the computer assumes that a metabolite concentration in a compartment is relatively uniform.

18. The computer readable storage medium of claim 14 wherein the computer is further programmed to determine the respect metabolite concentrations for the given metabolite independent of voxel location relative to the coil array.

19. The computer readable storage medium of claim 18 wherein the computer is further caused to determine the presence of abnormal pathologies in the single voxel from the respective metabolite concentrations.

20. A method of MR spectroscopy comprising the steps of:
   sampling a single voxel with a phased array coil assembly, the single voxel capable of containing normal tissue and an abnormal pathology; and
   determining a metabolite concentration value for a given metabolite in the abnormal pathology contained in the single voxel independent of metabolite concentration for the given metabolites corresponding to normal tissue contained in the single voxel.

* * * * *